United States Patent [19]

Yokoyama

[11] 4,223,273
[45] Sep. 16, 1980

[54] POWER AMPLIFYING DEVICE FOR DRIVING LOUDSPEAKERS

[75] Inventor: Kenji Yokoyama, Hamamatsu, Japan

[73] Assignee: Nippon Gakki Seizo Kabushiki Kaisha, Japan

[21] Appl. No.: 957,211

[22] Filed: Nov. 3, 1978

[30] Foreign Application Priority Data

Nov. 4, 1977 [JP] Japan .................................. 52-132373

[51] Int. Cl.² ............................................... H03F 1/34
[52] U.S. Cl. ..................................... 330/85; 179/1 F; 330/105
[58] Field of Search ................... 179/1 F; 330/85, 105, 330/108

[56] References Cited

U.S. PATENT DOCUMENTS

| 3,525,812 | 8/1970 | Verdier | 330/105 X |
| 4,092,494 | 5/1978 | Micheron | 179/1 F |

FOREIGN PATENT DOCUMENTS 283405  5/1968  Australia ........................... 179/1 F X

*Primary Examiner*—James B. Mullins
*Attorney, Agent, or Firm*—Claude A. S. Hamrick

[57] ABSTRACT

A power amplifier device comprising first and second output terminals connected to a loudspeaker, and a power amplifier having a non-inverting input supplied with an audio signal, an output connected to the first output terminal and an inverting input. The second output terminal is grounded through a first resistor and connected to an input of an inverting amplifier having a gain of -1. An output of the inverting amplifier is connected to the inverting input of the power amplifier through a second resistor. The output of the power amplifier is connected to its inverting input through a third resistor. The ratio of the third resistor to the second resistor is selected to be larger than 1 whereby the output impedance of the power amplifier device as seen from the first and second output terminals is made to be negative.

5 Claims, 9 Drawing Figures

TONE BURST WAVE
(f = 100 Hz
TWO CYCLE ON
TWO CYCLE OFF)

POWER AMPLIFYING DEVICE FOR DRIVING LOUDSPEAKERS

BACKGROUND OF THE INVENTION

This invention relates to power amplifying devices, more particularly to a power amplifying device containing a differential amplifier and having a load in the form of a loudspeaker.

Usually in a power amplifying device which amplifies a low frequency signal for supplying its amplified output to a loudspeaker which converts it into a musical tone, such speaker driving characteristics as the damping factor etc., are improved by designing the output impedance of the amplifier to be as small as possible. However, even when the output impedance of the power amplifier is small, where the resistance of a line interconnecting the power amplifier and the loudspeaker is large, such large line resistance degrades the characteristics described above. However, in the prior art power amplifier, since the resistance of the loudspeaker connecting line has not been considered, when the length of the line is large, not only is the damping factor determined by the ratio of the impedance of the loudspeaker to the output impedance of the power amplifier decreased but also the frequency characteristic is degraded.

SUMMARY OF THE INVENTION

Accordingly, it is an object of this invention to provide an improved power amplifying device having a load in the form of a loudspeaker wherein the impedance of a line interconnecting the power amplifying device and the loudspeaker does not affect the damping factor and the frequency characteristic of the loudspeaker.

According to this invention, this object can be accomplished by providing a current feedback circuit which equivalently makes the output impedance of the power amplifier device be negative.

According to this invention, there is provided a power amplifying device comprising a power amplifier having a non-inverting input, an inverting input and an output; a first output terminal connected to the output of the power amplifier; a second output terminal; the first and second output terminals being connected to a loudspeaker through a line; means for applying an input signal to the non-inverting input of the power amplifier, and characterized by current feedback means connected between the second output terminal and the inverting input of the power amplifier for making the output impedance of the power amplifying device negative as seen from the first and second output terminals.

BRIEF DESCRIPTION OF THE DRAWINGS

In the accompanying drawings.

Throughout the drawings, like parts are designated by like reference numerals.

DESCRIPTION OF THE PREFERRED EMBODIMENTS

Figure 1:
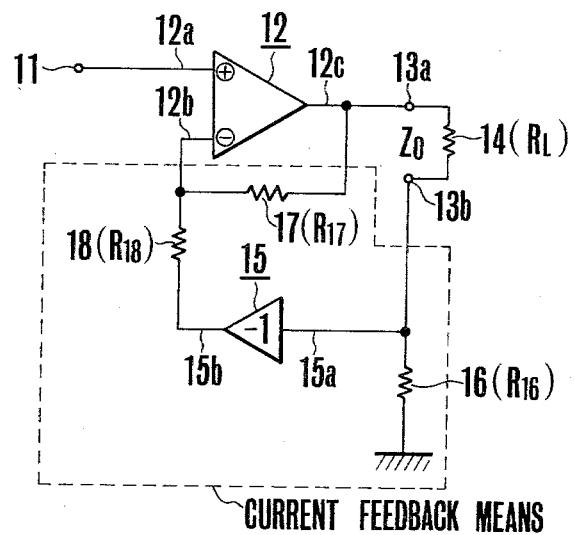
FIG. 1 is a connection diagram showing one embodiment of a power amplifying device loaded with a loudspeaker and embodying the invention.

In the first embodiment of this invention shown in FIG. 1, a low frequency audio signal is supplied to the non-inverting input terminal 12a of an amplifier 12 via an input terminal 11, and the output terminal 12c is connected to one output terminal 13a of the amplifier device. The amplifier 12 is not limited in its construction so long as it has inverting and non-inverting input terminals and preferably comprises a differential amplifier as its input stage. An amplifier using a differential amplifier in such a manner is well known and shown, for example, in FIGS. 2 and 3 of U.S. Pat. No. 3,986,134 dated Oct. 12, 1976. A load 14 having an impedance $R_L$ is connected between the output terminal 13a and the other output terminal 13b. The output terminal 13b is connected to the input terminal 15a of an inverting circuit 15, that is an amplifier circuit having a negative unity gain, and to ground through a resistor 16 having a resistance value $R_{16}$. a resistor 17 having a resistance value $R_{17}$ is connected between the output terminal 12c and the inverting input terminal 12b of the amplifier 12, and a resistor 18 having a resistance value $R_{18}$ is connected between the output terminal 15b of the inverting circuit 15 and the inverting input terminal 12b. Resistors 16, 17 and 18 and the inverting circuit 15 constitute current feedback means for the power amplifier device.

In this embodiment, the gain $A_0$ of the power amplifier device under no load is expressed by:

$$A_O = 1 + \frac{R_{17}}{R_{18}} \tag{1}$$

and the gain $A_L$ when load 14 is connected is expressed by:

$$A_L = \frac{A_O \cdot R_L}{R_L - R_{16} \cdot (A_O - 2)} \tag{2}$$

In this case, the open loop gain of the power amplifier device is made to be sufficiently large. The output impedance $Z_0$ appearing across output terminals 13a and 13b of the power amplifier device is generally shown by:

$$Z_O = \frac{R_L \cdot A_O}{A_L} - R_L \tag{3}$$

By substituting equations (1) and (2) for $A_0$ and $A_L$ shown in equation (3), the output impedance $Z_0$ is expressed by:

$$Z_O = R_{16} \cdot (2 - A_O) = R_{16} \cdot (1 - \frac{R_{17}}{R_{18}}) \tag{4}$$

Consequently, by making $R_{17}/R_{18} > 1$, it is possible to equivalently make the output impedance $Z_0$ have a negative value. Consequently, by setting the value of the output impedance $Z_0$ to a suitable negative value it is possible to equivalently decrease the resistance value of the load, that is to make the equivalent resistance value of the connecting line of the loudspeaker be zero.

Figure 2:
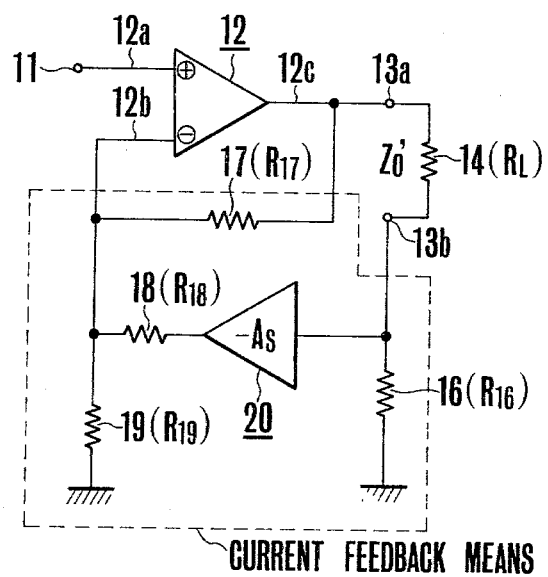
FIGS. 2, 3 and 4 are connection diagrams showing another embodiments of this invention.

FIG. 2 shows a second embodiment of this invention in which the inverting input terminal 12b of the amplifier 12 is grounded through a resistor 19 having a resistance value of $R_{19}$ and the inverting circuit 15 of the current feedback means is substituted by an amplifier 20 having a gain $-A_s$.

The gain $A'_0$ of this circuit under no load is expressed by the following equation:

$$A_0' = 1 + \frac{R_{17}}{R_{19}} + \frac{R_{17}}{R_{18}} \quad (5)$$

And the gain $A'_L$ when load 14 is connected is expressed by the following equation:

$$A_L' = \frac{1 + \frac{R_{17}}{R_{19}} + \frac{R_{17}}{R_{18}}}{1 + \frac{R_{16}}{R_L} \cdot (1 - A_s \frac{R_{17}}{R_{18}})} \quad (6)$$

In this case, the open loop gain of this device is selected to be substantially large. Accordingly, when the gains $A'_0$ and $A'_L$ calculated by these equations are substituted in equation (3) the output impedance $Z'_0$ of this amplifier device can be shown as follows:

$$Z_0' = R_{16} \cdot (1 - A_s \cdot \frac{R_{17}}{R_{18}})$$

Putting $R_{17} = R_{18}$, then $$Z'_0 = R_{16} \cdot (1 - A_s) \quad (8)$$

Thus, in this circuit too, by selecting the gain of the inverting circuit 20 at a suitable value, it is possible to set the output impedance $Z'_0$ to a suitable negative value.

Figure 3:
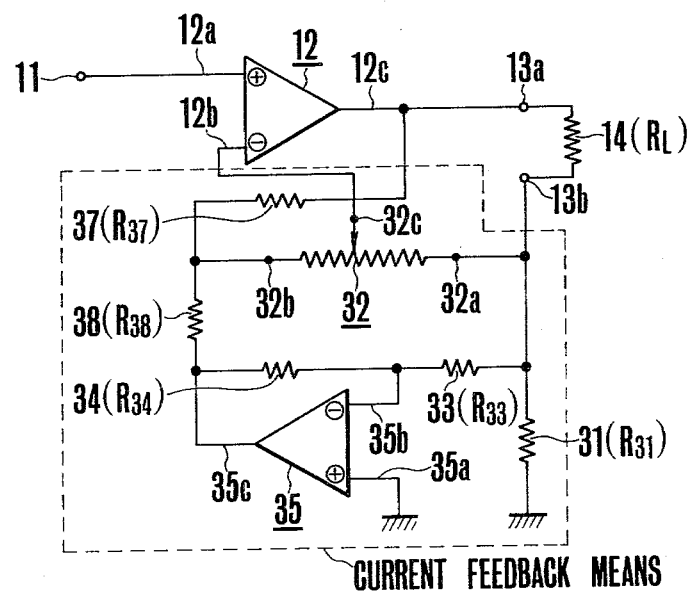

FIG. 3 shows a third embodiment of this invention in which the output impedance of the power amplifying device is variable from a positive value to a negative value. In the same manner as in FIG. 1, the input terminal 11 is connected to the non-inverting input terminal 12a of the amplifier 12 while the output terminal 12c thereof is connected to the output terminal 13a of the power amplifying device. Load 14, having a resistance value $R_L$, is connected between output terminals 13a and 13b and the output terminal 13b is grounded through a resistor 31 having a resistance value of $R_{31}$. Further, the output terminal 13b is connected to one fixed terminal 32a of a variable resistor or potentiometer 32 and to an inverting input terminal 35b of an operational amplifier 35 through a resistor 33 having a resistance value of $R_{33}$. A resistor 34 having a resistance value of $R_{34}$ is connected between the inverting input terminal 35b and an output terminal 35c of the amplifier 35. A non-inverting output terminal 35a of the amplifier 35 is grounded. The output terminal 12c of amplifier 12 is connected to the other fixed terminal 32b of the variable resistor 32 through a resistor 37 having a resistance value $R_{37}$, while the terminal 32b is connected to the output terminal 35c of the amplifier 35 through a resistor 38 having a resistance value $R_{38}$. The slidable contact 32c of the variable resistor 32 is connected to the inverting input terminal 12b of the amplifier 12.

In this circuit, when it is set that $$R_{33} = R_{34} \quad (9)$$
$$\frac{R_{37}}{R_{38}} = \frac{R_L}{2R_{31}} \quad (10)$$

the gain $A'_L$ when the load 14 is connected is shown by:

$$A_L'' = \frac{2R_{37}}{R_{38}} = \frac{R_L}{R_{31}} \quad (11)$$

which is constant. When the slidable contact 32c of the variable resistor 32 is moved to the righthand terminal 32a $$Z''_{0a} \cong R_{31} \cdot A$$

where A represents the open loop gain of the amplifier 12. When the slidable contact 32c of the variable resistor 32 is moved to the lefthand terminal 32b $$Z_{0b}'' = R_{31} \cdot (2 - A_0') = R_{31} \cdot (1 - \frac{R_{37}}{R_{38}}) \quad (12)$$

Thus, in this embodiment by moving the movable contact 32c of the variable resistor 32, the output impedance is varied from a positive value to a negative value so that when the output impedance is set to a suitable value it is possible to make the resistance value of the line connecting the loudspeaker to the amplifier device to be equivalently equal to zero.

Figure 4:
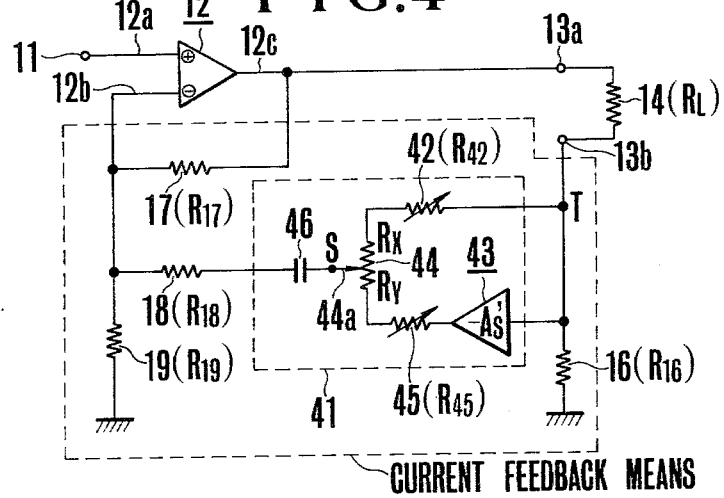

FIG. 4 shows a fourth embodiment of this invention which is identical to the circuit shown in FIG. 2 except that an inverting variable gain circuit 41 is substituted for the inverting circuit 20 shown in FIG. 2. The inverting variable gain circuit 41 comprises an inverting amplifier 43 having a gain $-A'_s$ ($A'_s > 1$), and an input terminal connected to the output terminal 13b. An end of a rheostat 42 having a resistance value $R_{42}$ is connected to the output terminal 13b, and the other end thereof is connected to one end of a potentiometer 44. The output terminal of the inverting amplifier 43 is connected to the other end of the potentiometer 44 through a rheostat 45 having a resistance value of $R_{45}$. The movable contact 44a of the potentiometer 44 is connected to one end of the resistor 18 via a capacitor 46 which has enough capacitance value to exhibit a low impedance against a very low frequency AC signal.

Denoting the voltage of a junction point S between the movable contact 44a of the potentiometer 44 and the capacitor 46 by $V_S$, the voltage of a junction between the output terminal 13b and resistor 16 by $V_T$, and the resistance values of the potentiometer 44 above and below the movable contact 44a by $R_X$ and $R_Y$ respectively, the following equation is obtained:

$$V_S = V_T \cdot (-A_s') \cdot \frac{R_{42} + R_X}{R_{42} + R_{45} + R_X + R_Y} + V_T \cdot \frac{R_{45} + R_Y}{R_{42} + R_{45} + R_X + R_Y} \quad (13)$$

The gain G of the variable gain circuit 41 can be determined from this equation as follows.

$$G = \frac{V_S}{V_T} = -A_s' \cdot \frac{R_{42} + R_X}{R_{42} + R_{45} + R_X + R_Y} + \frac{R_{45} + R_Y}{R_{42} + R_{45} + R_X + R_Y} \quad (14)$$

The output impedance $Z'''_0$ of the power amplifier device shown in FIG. 4 is calculated by the following equation (15) which can be derived from equation (1) described in connection with FIG. 2:

$$Z_O''' = R_{16} \cdot (1 + G \cdot \frac{R_{17}}{R_{18}}) \quad (15)$$

Consequently, from equations (14) and (15) following equation is obtained:

$$Z_O''' = R_{16} \{1 + \frac{R_{17}}{R_{18}} \cdot (1 - \frac{1 + A_s'}{1 + \frac{R_{45} + R_Y}{R_{42} + R_X}})\} \quad (16)$$

Thus, if the values of $R_{42}$, $R_{45}$, $R_X$, $R_Y$ and $A'_s$ are selected to satiffy the following relationship:

$$\frac{R_{17}}{R_{18}} \cdot \frac{1 + A_s'}{1 + \frac{R_{45} + R_Y}{R_{42} + R_X}} > 1 + \frac{R_{17}}{R_{18}} \quad (17)$$

a negative output impedance $Z'''_0$ is obtained.

Figure 5:
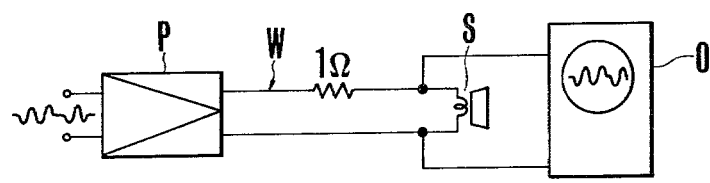
FIG. 5 is a connection diagram showing a tone burst testing device useful in explaining the advantages of this invention.

FIGS. 6 through 9 show the results of tone burst tests made on the power amplifying device of FIG. 4 embodying this invention. FIG. 5 shows the connection diagram of the testing device in which a loudspeaker S is connected to the power amplifying device P to be tested through a line W having a resistance of one ohm. A tone burst wave having a frequency of 100 Hz is applied at duty cycle of two cycles ON and two cycles OFF, and the output waveform derived out from the input terminals of the loudspeaker was displayed on an oscilloscope.

Figure 6:
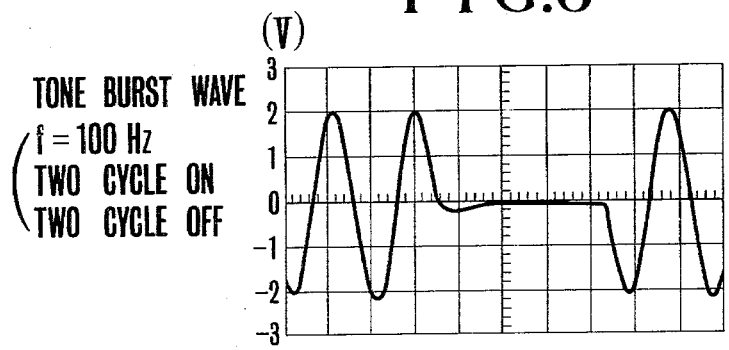
FIGS. 6 and 7 show output waveforms obtained by performing a tone burst tests on a prior art power amplifying device with the testing device shown in FIG. 5.
Figure 7:
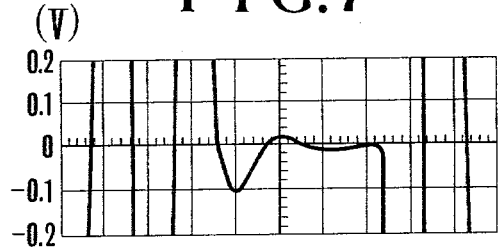
Figure 8:
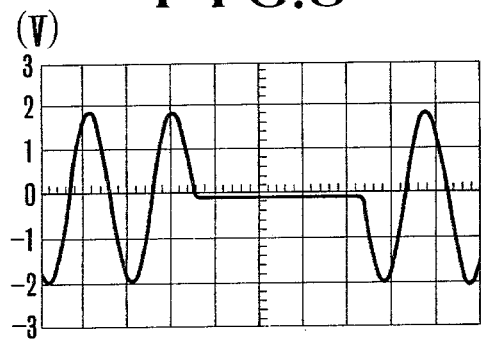
FIGS. 8 and 9 show output waveforms obtained by performing a tone burst test on the power amplifying device according this invention using the testing device shown in FIG. 5.
Figure 9:
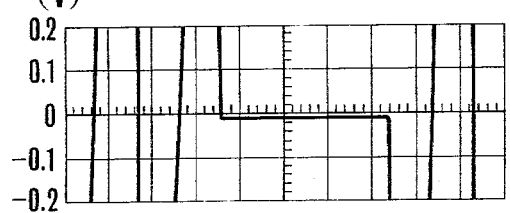

FIG. 6 shows the output waveform where the output impedance of the power amplifying device P was set to be one ohm. As shown, a transient distortion appears when the signal is OFF. FIG. 7 is an enlarged view of a portion of the curve shown in FIG. 6. FIG. 8 shows the output waveform where the output impedance was selected to be minus one ohm to cancel the line resistance. FIG. 9 shows an enlarged view of a portion of the curve shown in FIG. 8. As can be noted from FIGS. 8 and 9, no transient distortion of the waveform was formed.

As can be noted from the foregoing description, according to the power amplifying device of this invention it is possible to equivalently make zero the resistance of a line connecting the power amplifying device to a loudspeaker so that it is possible to eliminate such problems as a decrease in the damping factor and degradation of the frequency characteristic, thereby producing a power amplifying device having more excellent characteristics than prior art power amplifier devices.

I claim:

1. A power amplifying device comprising: power amplifier means having a noninverting input, an inverting input and an output;
a first output terminal connected to said output of said power amplifier means;
a second output terminal;
said first and second output terminals being connected to a loudspeaker through a line;
means for applying an input signal to said noninverting input of said power amplifier means; and
current feedback means connected between said second output terminal and said inverting input of said power amplifier means, said current feedback means comprising
a first resistor having one end connected to said second output terminal and the other end grounded,
inverting amplifier means having an input connected to said second output terminal, and
a potentiometer having one fixed end coupled to said second output terminal, the other fixed end coupled to an output of said inverting amplifier means and a slidable contact coupled to said inverting input of said power amplifier means, said potentiometer used to selectively cause the polarity of the feedback of said feedback means to be either negative or positive so as to thereby vary the output impedance of said power amplifier device over positive and negative ranges as seen from said first and second output terminals.

2. A power amplifying device according to claim 1 wherein said current feedback means further comprises a resistor connected between said output of said power amplifier means and said slidable contact of said potentiometer.

3. A power amplifying device according to claim 2 wherein said current feedback means further comprises variable resistors respectively connected between said one fixed end of said potentiometer and the output of said inverting amplifier and between said other fixed end of said potentiometer and said second output terminal.

4. A power amplifying device according to claim 1 wherein said current feedback further comprises a resistor connected between said output of said power amplifier means and the other fixed end of said potentiometer.

5. A power amplifying device according to claim 1 wherein said inverting amplifier means comprises an operational amplifier having a grounded noninverting input, an inverting input and an output, and
wherein said current feedback means further comprises:
a second resistor connected between said second output terminal and the inverting input of said operational amplifier;
a third resistor connected between the inverting input and the output of said operational amplifier;
a fourth resistor connected between the output of said operational amplifier and the other fixed end of said potentiometer; and
a fifth resistor connected between said other fixed end of said potentiometer and the output of said power amplifier means whereby said output impedance is varied between a positive value and a negative value.

* * * * *